United States Patent [19]

Lopes

[11] Patent Number: 5,043,797
[45] Date of Patent: Aug. 27, 1991

[54] COOLING HEADER CONNECTION FOR A THYRISTOR STACK

[75] Inventor: William F. Lopes, Groton, Mass.

[73] Assignee: General Electric Company, Schenectady, N.Y.

[21] Appl. No.: 503,446

[22] Filed: Apr. 3, 1990

[51] Int. Cl.⁵ ................ H01L 25/04; H01L 23/02; H01L 23/16

[52] U.S. Cl. .................... 357/82; 357/75; 357/81; 361/385; 165/80.4; 165/80.2; 165/104.33

[58] Field of Search ............... 357/82, 81, 75; 165/80.2, 80.4, 104.33; 361/385

[56] References Cited

U.S. PATENT DOCUMENTS

| | | | |
|---|---|---|---|
| 3,481,393 | 12/1969 | Chu | 165/80 |
| 3,790,859 | 2/1974 | Schraeder et al. | 317/100 |
| 3,989,099 | 11/1976 | Hosono et al. | 165/80 |
| 4,023,616 | 5/1977 | Scherbaum | 165/80 |
| 4,029,141 | 6/1977 | Ferrari et al. | 165/80 |
| 4,142,577 | 3/1979 | Klein | 165/80 |
| 4,226,281 | 10/1980 | Chu | 165/80 A |
| 4,317,952 | 3/1982 | Armor et al. | 174/15 BH |
| 4,492,975 | 1/1985 | Yamada et al. | 357/76 |
| 4,494,171 | 1/1985 | Bland et al. | 361/386 |
| 4,503,483 | 3/1985 | Basiulis | 361/385 |
| 4,513,346 | 4/1985 | Devins | 361/212 |
| 4,637,456 | 1/1987 | Niggemann | 165/104.33 |
| 4,866,503 | 9/1989 | Kushibiki et al. | 357/51 |

Primary Examiner—Rolf Hille
Assistant Examiner—David Ostrowski
Attorney, Agent, or Firm—Nixon & Vanderhye

[57] ABSTRACT

In a liquid cooled thyristor stack in which a plurality of disk thyristors are stacked between a plurality of cold plates such that each thyristor has a cold plate on either side thereof, relatively rigid tubular connectors are provided which extend between the cold plates and an associated coolant header. The connectors are provided at first ends with reduced diameter portions for receiving electrically non-conductive insulating bushings which are, in turn, received within ports of the coolant header.

19 Claims, 2 Drawing Sheets

FIG. 5(A) *(PRIOR ART)*

COOLING HEADER CONNECTION FOR A THYRISTOR STACK

BACKGROUND AND SUMMARY OF THE INVENTION

This invention relates to pipe connections for cooling headers, and more specifically, to connections between a coolant header and a liquid cooled thyristor stack or other electrical component which dissipates large amounts of heat.

Cold plates, or heat sinks are typically clamped between the thyristors of a thyristor stack and are cooled by liquid, e.g., deionized water, circulating through the plates, carrying heat away from the thyristors. The cold plates or heat sinks are connected to coolant headers by a plurality of flexible hoses and associated hose couplings or connectors. Over extended periods of time, the reliability, maintainability and survivability of flexible hoses in such an environment have not proven completely satisfactory. An example of a thyristor stack connected to coolant apparatus by means of flexible hoses is shown in U.S. Pat. No. 4,513,346.

It is also known to connect heat sinks clamped between a plurality of disk thyristors to a coolant header by means of a plurality of heat pipes, each of which is provided with flexible bellows-type connectors at either end. An arrangement of this type is disclosed in U.S. Pat. No. 4,023,616.

It is an object of this invention to minimize the number of flexible hoses and associated connections needed to establish communication between the cold plates, or heat sinks, of a thyristor stack and a nearby coolant manifold or header.

In one exemplary embodiment of the invention, ports of the cold plates or heat sinks of a disk-type thyristor stack (incorporated into, for example, a cyclo-converter) are provided as integral substantially rigid tubular members which extend away from the cold plate and are connected directly to an associated coolant manifold or header. The free ends of the relatively rigid tubular members each have a reduced diameter portion for receiving an electrically non-conductive insulating bushing, having a cylindrical forward body portion and a rearward radial flange. The insulating bushing may be telescoped over the reduced diameter portion of the tubular member so that the radial flange abuts against a radial shoulder formed in the wall of the tubular member.

The insulating bushing is designed for reception within an appropriate opening, or inlet, in the coolant manifold, the opening provided with a plurality of axially spaced O-rings for providing a fluid seal between the insulating bushing and the manifold. The O-rings also allow relative movement between the tubular member and the manifold during shock conditions, but restrain any significant and undesirable movement of the tubular member via the bushing in both an axial and lateral directions.

It will be appreciated that the above described arrangement permits the elimination of the conventional cold plate-to-coolant manifold hoses, while at the same time, permitting quick connection and disconnection of the thyristor stack from the coolant manifold.

Another advantage of the invention is that it can be used with relatively thick walled, flat plate-type coolant manifolds where the inlets are drilled through the relatively thick plate, or in tubular coolant manifolds where the inlets are in the form of welded nipples projecting from the manifold. In either case, the axially spaced O-rings are provided to seal against the insulating bushing.

A further advantage of this invention is that parallel cooling of each of the cold plates is facilitated. In the past, the thyristor cold plates has been arranged typically in a series cooling loop, apparently in order to reduce cooling hose complexity. Since the utilization of coolant hoses have been eliminated with the present invention, a more efficient parallel cooling arrangement is easily implemented, if desired.

It will be understood by those of ordinary skill in the art that the connector construction in accordance with this invention is not limited to use with cold plates of thyristor stacks, but may be utilized in conjunction with other components as well.

Additional objects and advantages of the present invention will become apparent from the detailed description which follows.

BRIEF DESCRIPTION OF THE DRAWINGS

FIG. 5a schematically illustrates a conventional cooling arrangement wherein a plurality of cold plates are connected in series.

DETAILED DESCRIPTION OF THE DRAWINGS

Figure 1:
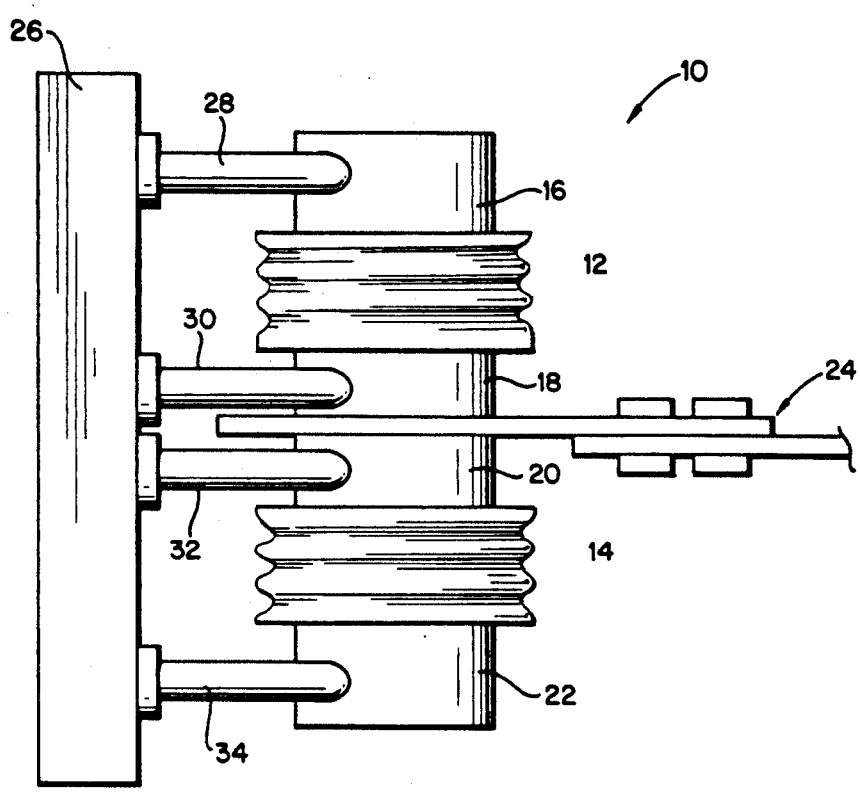
FIG. 1 is a side elevational view of a thyristor stack connected to a coolant manifold in accordance with an exemplary embodiment of this invention.
Figure 2:
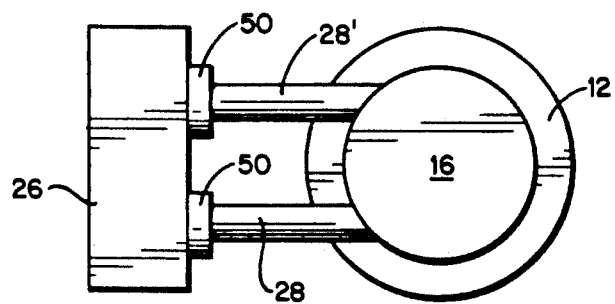
FIG. 2 is a partial plan view of the apparatus shown in FIG. 1.

With reference to FIGS. 1 and 2, a disk-type thyristor stack arrangement 10 includes disk thyristors 12, 14 sandwiched by a plurality of cold plates 16, 18, and 20, 22, respectively, and a bus bar connection 24. It will be understood that the construction of the cold plates, the disk thyristors and the electrical connection at the bus bar per se form no part of this invention.

Because of the large amounts of heat generated by the thyristor stack, a coolant loop is provided including a coolant manifold or header 26 which is connected to the cold plates 16, 18, 20 and 22 by a plurality of conduits or connectors 28, 30, 32 and 34, respectively. With specific reference to FIG. 2, it will be appreciated that each cold plate is connected to the coolant header 26 by a pair of conduits, only one of which is shown at 28' in FIG. 2. It will be understood that a similar paired arrangement is utilized for each of the cold plates 18, 20 and 22 as well, enabling coolant to flow to and from each cold plate.

In a preferred arrangement, the conduits extending between the cold plates 16, 18, 20 and 22 and the coolant header 26 are formed as integral rigid extensions of the cold plates. In other words, each of the conduits or connectors 28, 30, 32 and 34 (and the additional paired conduits, such as 28') are formed integrally, (e.g., welded) with their associated cold plates 16, 18, 20 and 22, and extend the full distance between the cold plates and the coolant header or manifold 26 for direct connection therewith.

Figure 3:
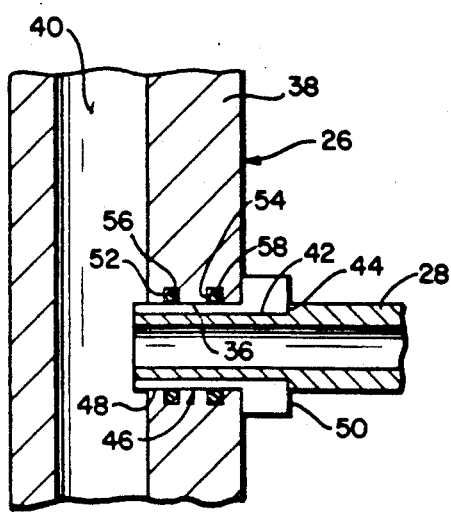
FIG. 3 is a partial side section view illustrating one embodiment of a coolant manifold connection in accordance with this invention.

With reference now to FIG. 3, a detailed sectional view illustrates the connection between the conduit or connector 28 and the coolant header 26 in accordance with one exemplary embodiment of the invention. It will be understood that each of the connections between the various tubular conduits 28', 30, 32, 34, etc., and the coolant header 26 are identical, so that only one need be described in detail.

The tubular conduit or connector 28 is adapted to fit within a bore 36 formed within a relatively thick flat plate 38 of the header 26 leading to a coolant passage 40. The tubular conduit or connector 28 is formed with a reduced diameter portion 42, terminating at a radial shoulder 44 spaced axially inwardly of the free end of the conduit or connector 28. An insulating bushing 46, constructed of an electrically non-conductive material such as plastic, is telescoped over the reduced diameter portion 42 of the conduit or connector 28. The insulating bushing 46 is formed with a substantially cylindrical forward portion 48 and a rearward radial flange 50, the rearward face of which abuts the radial shoulder 44 when fully telescoped over the reduced diameter portion 42 of the connector 28.

The insulating bushing 46 may be secured to the reduced diameter portion 42 by any suitable leak resistant means such as threading, heat shrinking, or chemical sealing.

The peripheral surface of the bore 36 is formed with a pair of axially spaced grooves 52, 54 for receiving a pair of O-rings 56, 58 which sealingly engage the insulating bushing 46 when the latter is inserted in the bore 36, with the forward face of the flange 50 abutting the plate 38. These O-rings also provide an additional advantage in that they allow relative movement between the conduit or connector 28 and the manifold 26 under shock conditions, but at the same time, they tend to restrain any significant unwanted movement of the bushing 46 and conduit or connector 28 in both axial and lateral directions. In this regard, it is desirable that the bushing 46 have some degree of resilience to accommodate whatever movement may occur.

Figure 4:
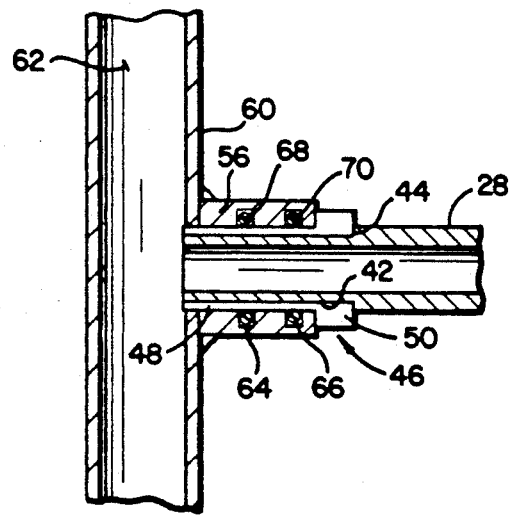
FIG. 4 is a partial side section view illustrating another coolant connection in accordance with an alternative embodiment of the invention.

With reference now to FIG. 4, an alternative arrangement is illustrated wherein a tubular coolant header 60 is shown, having an interior coolant passage 62. Openings or ports in the tubular header or manifold 60 are further defined by outwardly extending hollow nipples 56 which can be welded or otherwise formed about the opening in the header. Here again, since all of the connections are identical, only one need be described in detail. The interior surface of the nipple is also provided with axially spaced grooves 64, 66 for receiving a pair of O-rings 68, 70 in the same manner as provided in the flat plate 38 of the FIG. 3 embodiment. The connection between the tubular member 28 and the coolant header 54 is otherwise identical to that shown in FIG. 3, and with similar advantages.

Thus, the connector 28 with bushing 46 secured thereto as described above, may be inserted into the open end of nipple 56 until the forward face of flange 50 engages the nipple. The O-rings 68, 70 sealingly engage the bushing 46 as in the FIG. 3 embodiment.

Figure 5B:
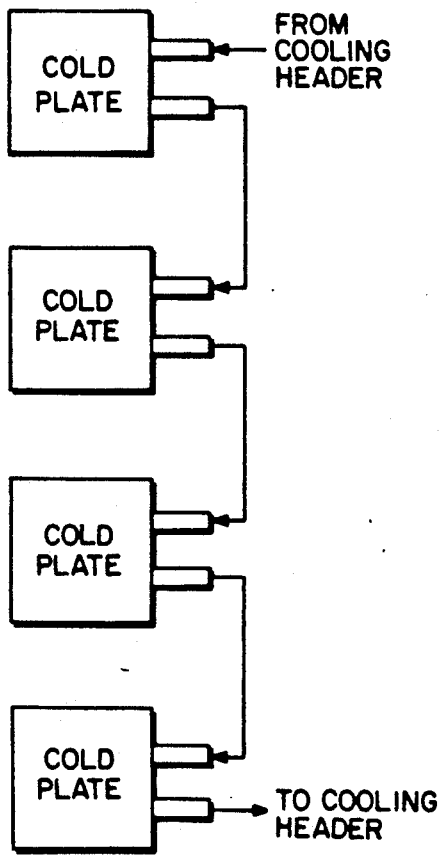
FIG. 5b illustrates a plurality of cold plates connected in parallel in accordance with this invention.
Figure 5B:
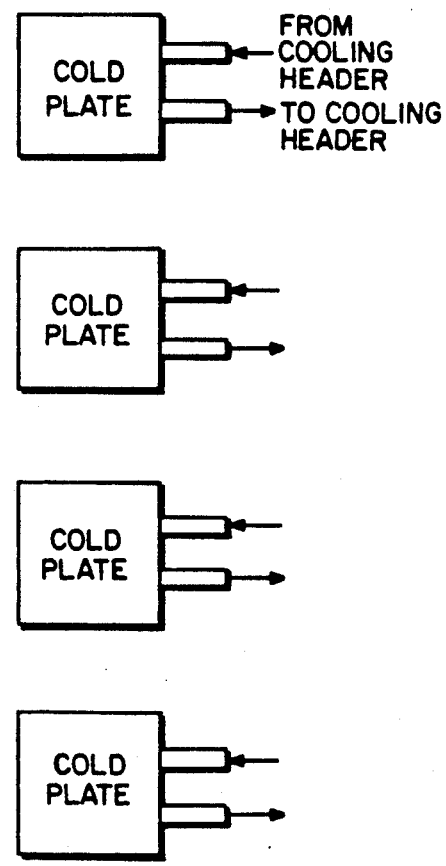

In light of the elimination of the troublesome flexible hose connections utilized in conventional thyristor stack arrangements, the present invention also facilitates parallel cooling connections between the thyristor stack and the coolant header. In the past, and as shown schematically in FIG. 5a, cold plates, or heat sinks, have been connected to an associated coolant header (not shown) in series connection, as shown by the arrows, primarily to simplify the otherwise complex flexible hose connections. As a result of the present invention, parallel connection with a coolant header as shown in FIG. 5b is facilitated. This is highly desirable since parallel cooling is far more efficient than series cooling. It will be understood, of course, that the present invention may be used in series or parallel.

As previously indicated, the advantages of this connector construction are applicable to any number of coolant systems where it is desirable to eliminate flexible hose connections for reliability, durability, etc. Thus, while the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. In a liquid cooled thyristor stack in which a plurality of disk thyristors are stacked between a plurality of cold plates such that each thyristor has a cold plate on either side thereof, the improvement comprising at least one substantially rigid connecting conduit extending from each cold plate, said connecting conduit adapted for slidable, sealing connection at a free end thereof with a coolant manifold in proximity to said thyristor stack, wherein said connecting conduit is provided at said free end with a reduced diameter portion, and wherein an electrically non-conductive insulating bushing is seated on and fixedly secured to said reduced diameter portion.

2. In a liquid cooled thyristor stack in which a plurality of disk thyristors are stacked between a plurality of cold plates such that each thyristor has a cold plate on either side thereof, the improvement comprising at least one substantially rigid connecting conduit extending from each cold plate, said connecting conduit adapted for slidable, sealing connection at a free end thereof with a coolant manifold in proximity to said thyristor stack, wherein said connecting conduit is provided at said free end with a reduced diameter portion, and wherein an electrically non-conductive insulating bushing is mounted on said reduced diameter portion, wherein said insulating bushing is sealed to said reduced diameter portion.

3. A liquid cooled thyristor stack according to claim 1 wherein said insulating bushing is formed with first and second diameter portions, said second diameter portion having a larger diameter than said first diameter portion.

4. A liquid cooled thyristor stack according to claim 3 wherein said first diameter portion has a free edge flush with an edge of said free end of said reduced diameter portion.

5. A liquid cooled thyristor stack according to claim 4 wherein said reduced diameter portion terminates at a shoulder, and wherein said second diameter portion of said insulating bushing engages said shoulder.

6. A liquid cooled thyristor stack according to claim 1 wherein said plurality of cold plates are adapted for connection to said coolant manifold in series.

7. A liquid cooled thyristor stack according to claim 1 wherein said plurality of cold plates are adapted for connection to said coolant manifold in parallel.

8. A liquid cooled thyristor stack according to claim 1 in combination with a coolant manifold provided with at least one bore adapted to receive said insulating bushing, said bore having mounted therein one or more sealing rings.

9. A liquid cooled thyristor stack according to claim 8 wherein said bore is drilled in a flat plate.

10. A liquid cooled thyristor stack according to claim 8 wherein said coolant manifold comprises a tube having a plurality of circular holes formed therein and a nipple secured at each said hole, projecting from said tube, and further wherein said nipple has mounted therein one or more sealing rings, and is adapted to receive said insulating bushing.

11. A connector for feeding coolant between an electrical component and an associated coolant header, said connector comprising a substantially rigid tubular member integrally connected at one end to a cold plate, and connected at the other end to a coolant manifold, said other end having a reduced diameter portion with an insulating bushing telescoped thereon for slidable and sealing engagement in openings provided in the coolant manifold.

12. A connector according to claim 11 wherein said insulating bushing is sealed to said reduced diameter portion.

13. A connector according to claim 12 wherein said insulating bushing is formed with first and second diameter portions, said second diameter portion having a larger diameter than said first diameter portion.

14. A connector according to claim 13 wherein said first diameter portion has a free edge flush with a free edge of said reduced diameter portion, and said second diameter portion engages a shoulder formed in said connector.

15. A connector according to claim 11 wherein said insulating bushing is constructed of plastic material or similar material.

16. In combination, a thyristor stack and associated coolant manifold, said thyristor stack comprising a plurality of disk thyristors in alternating arrangement with a plurality of cold plates, each cold plate having a pair of substantially rigid tubular connector integrally formed at first ends with said cold plate and secured at second ends to said coolant manifold, each of said tubular connectors being provided with a reduced diameter at said second end and an electrically non-conductive bushing telescoped thereon, and wherein said coolant manifold is provided with a plurality of ports, each adapted to slidably receive an associated one of said insulating bushings in sealing engagement therewith.

17. The combination according to claim 16 wherein each of said ports is provided with a plurality of sealing rings adapted to engage one of said insulating bushings.

18. The combination according to claim 16 wherein said plurality of cold plates are connected to said coolant manifold in series.

19. The combination according to claim 16 wherein said plurality of cold plates are connected to said coolant manifold in parallel.

* * * * *